United States Patent [19]

Kato

[11] Patent Number: 4,652,436

[45] Date of Patent: Mar. 24, 1987

[54] PREPARATION OF NITRIDE AND CARBIDE FROM INORGANIC-ORGANIC POLYMER COMPLEX

[75] Inventor: Chuzo Kato, Tokyo, Japan

[73] Assignee: Osaka Yuki Kagaku Kogyo Kabushiki Kaisha, Osaka, Japan

[21] Appl. No.: 752,440

[22] Filed: Jul. 8, 1985

[30] Foreign Application Priority Data

Mar. 5, 1985 [JP] Japan .................................. 60-41998

[51] Int. Cl.⁴ ..................... C01B 21/06; C01B 31/30; C01B 31/36
[52] U.S. Cl. .................................. 423/406; 423/409; 423/411; 423/412; 423/439; 423/440
[58] Field of Search ............... 423/439, 440, 406, 409, 423/411, 412

[56] References Cited

U.S. PATENT DOCUMENTS 3,403,008  9/1968  Hamling ............................. 423/291

FOREIGN PATENT DOCUMENTS

| 277467 | 1/1964 | Australia | 423/439 |
| 3639 | 2/1974 | Japan | 423/440 |
| 25500 | 3/1976 | Japan | 423/409 |
| 6311 | 1/1978 | Japan | 423/440 |

Primary Examiner—John Doll
Assistant Examiner—Wayne A. Langel
Attorney, Agent, or Firm—Armstrong, Nikaido, Marmelstein & Kubovcik

[57] ABSTRACT

Nitrides and carbides are prepared by intercalating a monomer, a starting material of condensate, or a prepolymer into the interlamellar spaces or the vacant spaces of the crystalline structure of a natural mineral or an inorganic compound to prepare an intercalated compound and baking the intercalated polymer compound at a temperature in the range of 1100°–1700° C. under a nitrogen or reducing atmosphere. The present invention provides a method for readily preparing nitrides and carbides having the increased crystallinity at a low calcination temperature. Whiskers with larger diameters of 2 to 5 $\mu$m can be prepared by adding carbon powder to the intercalated compound complex.

2 Claims, No Drawings

PREPARATION OF NITRIDE AND CARBIDE FROM INORGANIC-ORGANIC POLYMER COMPLEX

BACKGROUND OF THE INVENTION

Carbides and nitrides, represented by silicon carbide and silicon nitride, possess excellent properties such as hardness, thermal conductivity, heat resistance, thermal shock resistance, and chemical stability. They are being used increasingly as grinding and polishing materials, fire resistant materials, heating elements, electrical parts, and disoxidants. They are produced by calcining a mixture of a material powder and carbon under a reducing atmosphere or nitrogen gas atmosphere.

Silicon carbide is at present prepared as follows.

Alpha-silicon carbide powder is generally produced by filling a mixture of silica and coke in an electric resistant furnace, heating the mixture with application of electricity, and grinding and classifying the obtained crystalline lump.

To produce beta-silicon carbide, the following five methods have been employed.

(1) A direct reaction of silicon with carbon: A mixture of silicon powder and fine carbon powder such as carbon black is calcined at a temperature in the range of 1000°–1400° C.

(2) Reduction reaction of silica with carbon: A mixture of silica powder and fine carbon powder is calcined at a temperature in the range of 1500°–1800° C. under an inert atmosphere. This method is being employed in an industrial scale as a stable method for continuous mass production with use of a vertical reaction furnace.

(3) Vapor phase reaction: Hydrocarbon is reacted with silicon tetrachloride or silicon tetrahydrogenate, or varying alkylsilanes are subjected to thermal decomposition. This method is suitable to produce micronized powder of a particle size of less than 0.1 $\mu$m having high purity and less aggregation. It, however, has various drawbacks, for example, that the material gas is expensive and the used apparatus is corroded by chlorides.

(4) Gas evaporation: The raw materials are heated at high temperature to be evaporated and subjected to a reaction, and the prepared fine particles are aggregated. It has been studied to employ a method of directly passing electricity or making an arcing between a carbon rod and silicon. This method has not been put in practice.

(5) Thermal decomposition of organic silicon polymer: An organic silicon polymer represented by polycarbosilane is thermally decomposed at a temperature more than 1500° C. under a non-oxidizing atmosphere. Since the material organic silicon polymer is quite expensive, this method is not so suitable for the industrial production of beta-silicon carbide powder.

As described above, silicon carbide is at present industrially produced by simply mixing material powders macroscopically and calcining the prepared mixture under a reducing atmosphere or an inert atmosphere. Other carbides or nitrides are prepared in the form of powder through a macroscopical contact of powder solids although the vapor phase reaction is employed when they are produced in the form of whisker. It may be summarized from the above that synthesis of carbide or nitride powder depends on a reaction among solid particle surfaces of a material mixture caused by calcination of the mixture at high temperature, or a reaction of the sublimed gaseous components or a thermal decomposition reaction thereof. Consequently, the reaction must be carried out at amply high temperature under a reducing atmosphere or inert atmosphere to satisfactorily produce nitrides and carbides.

SUMMARY OF THE INVENTION

When compounds containing carbon and nitrogen atoms are present in every crystal layer of the raw material, the reaction proceeds at a molecular level. The reaction can be carried out at a temperature more than 100° C. lower than that in a macroscopic mixing method. Besides, the yield of carbide and nitride is increased, and the crystallinity is improved. Accordingly, the present invention employs a method that a polar substance is intercalated into the interlamellar spaces of an inorganic material having a lamellar structure to enlarge the interlamellar spaces; a starting material of polycondensate, a monomer, or a prepolymer is intercalated into the interlamellar spaces; and the resulting product is condensed or polymerized with a radical initiator to form an inorganic-organic polymer intercalation compound. This complex is heated at 200°–250° C. to acquire flame resistant properties and baked at a temperature in the range of 1100°–1700° C. under a reducing atmosphere or in a stream of inert gas.

DETAILED DESCRIPTION OF THE INVENTION

The substance to be intercalated into the interlamellar spaces may be an inorganic compound. Where a polymerized or condensed organic substance is intercalated into the spaces, hydrocarbon and carbon monoxide formed due to the thermal decomposition at high temperature keep the interior of the reaction furnace under a reducing atmosphere, and the remaining carbon becomes a raw material for carbide. Nitride can be suitably produced by calcining a compound containing nitrogen in an atmosphere of nitrogen. The organic compound present in the interlamellar spaces generally evaporate at a temperature lower than 200° C. and disappear unless it is converted into a high-molecular compound. To prevent such evaporation, a polymer is directly intercalated, or a monomer or prepolymer is intercalated and polymerized or condensed so that the evaporation does not take place until a temperature is raised high.

The present invention is novel on the following points.

(1) A prescribed organic compound and solvent are intercalated in advance into the host interlamellar spaces of a lamellar structured substance in order to enlarge the interlamellar spaces, so that a guest reaction substance can be easily entered into these spaces.

(2) An inorganic or organic guest reaction substance is intercalated into the enlarged host interlamellar spaces, so that the guest reaction substance contacts with the crystal faces of every layer of the host crystal and the reaction can be conducted microscopically.

(3) The guest reaction substance intercalated into the host interlamellar spaces is polymerized or condensed, so that the guest reaction substance is directly reacted with the host crystal faces without suffering evaporation of the reaction substance until its temperature is raised high.

(4) The guest reaction substance is converted into a high-molecular compound and subjected to a flame resistant treatment at a temperature in the range of 200°-250° C. This treatment allows the intercalated guest reaction substance to react until its temperature rises high without suffering evaporation and eliminates the organic substance which is used to enlarge the interlamellar spaces of the host crystal. Since the decomposition product enhances the reducing atmosphere, the reaction readily proceeds, the reaction temperature is lowered, the yield is increased, and the crystallinity is increased.

A method for the production of silicon carbide and silicon nitride by calcining a mere mixture of raw materials of 400 meshes (by Tyler standard sieve; the same is applied throughout the specification) was compared with the method of the present invention using synthetic polysilicic acid. The test results indicate the superiority of the present invention as follows. The calcination could be done at a temperature low by 100°-200° C. to obtain the same yield; the yield was increased by 20-90% when the calcination was conducted at the same temperature of 1100°-1600° C. for the same period of time; and it was confirmed by X-ray diffraction that the crystallinity was increased even when the calcination was conducted at the same temperature for the same period.

This invention will be explained below in detail.

(A) SYNTHESIS OF CARBIDES

Magadiite $Na_2Si_{14}O_{29} \cdot XH_2O$, one of lamellar polysilicates, is present in nature but can be synthesized. The basal spacing of its crystalline layers is 15.6Å and Na ions are present between the layers. When magadiite is immersed in an aqueous alkyl ammonium solution, ion exchange takes place between Na ions and alkyl ammonium ions, forming magadiite-alkyl ammonium intercalation compound. Because of the ion exchange between alkyl ammonium ions and Na ions, the basal spacing increases to more than 20Å. This magadiite-organic complex is immersed in styrene monomer to prepare styrene-magadiite intercalation compound. To this compound is added a polymerization initiator to polymerize styrene, thereby preparing magadiite-polystyrene intercalation compound complex. It is confirmed by thermal analysis that styrene in an amount corresponding to about 90 wt % of the amount of magadiite is intercalated into the interlamellar spaces though a little scattering in the amount is observed depending on the preparation conditions. The magadiite-polystyrene intercalation compound complex is then heated at a temperature in the range of 200°-250° C. to evaporate the unpolymerized styrene and the alkyl ammonium used to enlarge the interlamellar spaces, then the interlamellar spaces are contracted to connect fast the crystal face and styrene. The magadiite-polystyrene intercalation compound complex thus provided with flame resistant properties is calcined at a temperature in the range of 1100°-1500° C. under a reducing atmosphere to produce silicon carbide.

Separately from the above method, a comparative experiment was conducted with regard to a mixture of magadiite and polystyrene in the equal weight ratio. Magadiite of lamellar polysilicate magadiite was treated with an acid to remove sodium ions. The resulting lamellar polysilicate magatiite was dried and reduced to powder of 400 meshes. The powder was immersed in a polystyrene-containing benzene solution in a weight equal to that of the powder, then agitated thoroughly to prepare a uniform mixture. The mixture was heated at 100° C. to evaporate benzene, thereby preparing a macroscopically uniform mixture of magadiite and polystyrene. This magadiite-polystyrene mixture was once heated to 200°-250° C. and calcined at a prescribed temperature. The resultant product was compared with the compound prepared by the aforesaid method.

The results revealed that when the calcination was conducted under a reducing atmosphere at a temperature in the range of 1100°-1500° C. for the same period of time, silicon carbide prepared by the method of the present invention had the yield larger by 30-80% than that of the product prepared from the above macroscopically uniform mixture; the temperature required for the preparation of the equal amount of carbide was lower in the case of using the intercalation compound complex by 100°-150° C. than that required in the calcination of the above macroscopically uniform mixture; and the improvement of the crystallinity was confirmed by sharpened peaks checked by X-ray diffraction. It is proved that in the method of calcining the intercalation compound complex according to the present invention, microscopical reaction takes place on every crystal face.

(B) SYNTHESIS OF NITRIDES

In the aforesaid method (A), the following is an example of using 4-vinylpyridine as a guest organic substance.

Following the procedure of the above method (A), the interlamellar spaces of magadiite were enlarged with alkyl ammonium salt. The magadiite was then immersed in a guest organic substance 4-vinylpyridine containing a polymerization initiator, and polymerized at 80° C. The resulting product was subjected to flame resistant treatment at a temperature in the range of 200°-250° C. Thus, alkyl ammonium was decomposed and evaporated, forming magadiite-polyvinylpyridine intercalation compound complex. This complex was then calcined in a stream of nitrogen gas at a temperature in the range of 1100°-1600° C. to form silicon nitride.

When this product was compared with that prepared by the calcination of a magadiite-polyvinyl pyridine mixture, it was confirmed that the method of the present invention increased the amount of silicon nitride produced by 20-80%; lowered the temperature for preparing the equal amount of silicon nitride by 100°-150° C.; and increased the crystallinity as confirmed by X-ray diffraction. It is clear from the above that a microscopical reaction took place on the crystal faces as was in the above (A).

(C) SYNTHESIS OF CARBIDE, NITRIDE, AND SIALONS

Montmorillonite, one of 2:1 type clay minerals having a lamellar structure, usually contains alkali metal ions such as sodium ion, potasium ion, etc. and alkaline earth metal ion such as calcium ion, magnesium ion, etc. as an exchangeable cation between the crystalline layers. These ions are hydrated respectively. The interlamellar spaces are generally in the range of 2-6Å which varies depending on the hydrated degree. When the montmorillonite is dried to drive out the water content, the spaces including cation columns are formed. And it is possible to adjust an amount of exchangeable cations by pretreatment with an acid. Organic cations and various organic molecules take the place of these inorganic cations in the interlamellar spaces and for intercalation compounds. Also, these interlamellar spaces can be enlarged by having organic solvents itercalated therein.

When the montmorillonite having the above features is treated with an aqueous alkylammonium salt solution, alkylamine montmorillonite intercalation compound is formed as a result of intercalation of alkylammonium ion. After washing, drying, and grinding, the montmorillonite organic complex is immersed in acrylonitrile monomer to prepare alkylamine acrylonitrile-montmorillonite intercalation compound. A polymerization initiator is added to the above compound to polymerize acrylonitrile of the above compound, thereby obtaining montmorillonite-polyacrylonitrile complex. The reason that the alkylamine montmorillonite complex is prepared in advance is to intercalate acrylonitrile monomer as much as possible into the interlamellar spaces. Organic solvents such as benzene and toluene can be employed to adjust the absorbed amount of acrylonitrile monomer or to enlarge the interlamellar spaces. Although a little difference is involved depending on the preparation conditions, thermogravimetric analysis has confirmed that organic compounds in an amount corresponding to about 90 wt % of montmorillonite are intercalated into the montmorillonite.

Next, the montmorillonite-polyacrylonitrile complex is heated at 200°-250° C. to cyclize the polyacrylonitrile which is present in the interlamellar spaces, thereby giving flame resistant properties to the complex so that the polyacrylonitrile does not evaporate at high temperature. The resulting montmorillonite-polyacrylonitrile complex is burned to a temperature over 1100° C. in an inert gas or under a reducing atmosphere to obtain nitride, carbide, and sialons.

Since the montmorillonite contains preponderantly $SiO_2$ and $Al_2O_3$ and a small amount of $Fe_2O_3$, MgO, CaO, $Na_2O$, and $K_2O$, pure carbide or nitride cannot be prepared by the calcination of montmorillonite-polyacrylonitrile intercalation compound. In addition to the above carbide and nitride, beta-sialon and aluminum nitride are prepared simultaneously.

The results obtained by the comparison of the temperature used for the preparation of the product by the method of this invention with that used for the preparation of the calcination product of the montmorillonite-polyacrylonitrile mixture are as follows.

The production of beta-sialon was initiated when the temperature was 1100° C. in the case of the calcination product of the intercalation compound complex while it was 1300° C. in the case of the calcination product of the mixture; the production of bata-carbide was initiated at 1150° C. in the former case and 1250° C. in the latter case; the production of aluminum nitride was initiated at 1300° C. in the former case and 1500° C. in the latter case; and the production of beta-silicon nitride was initiated at 1400° C. in the former case and 1500° C. in the latter case. It is clear from the above that the production temperature was lowered by 100°-200° C. When the calcination temperature is the same, the present invention increases the content of the above compounds produced. X-ray diffraction confirmed that the crystallinity of each compound was increased when prepared by calcining the intercalation compound complex as compared with that prepared by calcining the mixture. It was confirmed from the above that the product prepared by intercalating an inorganic or organic compound into the interlamellar spaces of a compound, polymerizing or condensing the intercalation product, conducting a flame resistant treatment, and calcining at a temperature in the range of 1100°-1600° C., is superior to the product prepared by calcination of a mixture in the calcination temperature, yield, and crystallinity because of the microscopical reaction of the crystal faces.

It is also possible to prepare whiskers efficiently by the method of this invention. Whiskers of silicon carbide and silicon nitride now on the market are produced by a vapor phase reaction of CO or $N_2$ gas with SiO gas formed by reducing $SiO_2$. At any rate, when one of the reacting components is a solid, silicon carbide or silicon nitride is formed in the form of powder.

As described above, silicon carbide and silicon nitride are prepared by calcining an intercalation compound complex which is prepared by intercalating an inorganic or organic compound into interlamellar spaces and polymerizing or condensing the resulting product; the above calcination is carried out at a temperature 100°-200° C. lower than that for the calcination of a mere mixture; and the yield and crystallinity are increased.

Similar tendency is observed in the production of whiskers and when carbon powder is added to an intercalation compound complex, whiskers are more readily produced. Whiskers heretofore produced have a diameter of 0.1–1 $\mu$m. The present invention has a characteristic feature of producing whiskers having a diameter of 2–5 $\mu$m. This fact is confirmed by an electron microscope photograph. When these whiskers are incorporated into metals and plastics, the metals and plastics have their strength enhanced greatly than the conventional whiskers are used.

Instead of the montmorillonite used above, the following inorganic compounds may be used as the host crystalline starting materials. They are lamellar clay minerals such as kaolinite, halloysite, vermiculite and others, fibrous clay minerals (inosilicate) such as sepiolite and attapulgite, and natural or synthetic minerals such as zeolite (tectosilicate) having a three dimensional network structure such as clinoptilolite, mordenite, etc. It is also possible to use any compound which includes polisilicic acid having a lamellar structure, graphite, chalcogen compounds, oxide, oxyhalogen compounds, black phosphorous, zirconium phosphate, inorganic compounds of transition metal oxyacid salts, and synthetic zeolite having a three dimensional network structure.

The organic compounds which enlarge the interlamellar spaces or intercalate into the three dimentional network crystal spaces include the polar compounds such as butylamine, hexylamine, dodecylamine, octadecylamine, benzylamine, and other alkylamines, and amides such as formamide, acetamide, etc. Even a nonpolar organic compound can be intercalated into the spaces when the immersing conditions are suitable.

Preferable solvents are benzene, toluene, xylene, pyridine, and others containing carbon atom or nitrogen atom. Examples of the monomers include acrylonitrile, styrene, acrylic acid, methacrylic acid, methyl methacrylate, vinyl pyridine, etc. The preferable primary condensation polymerization products or prepolymers are urea resin, phenol resin and others, which are not volatilized by heating in the course of polymerization or polycondensation process. In the interlamellar spaces they react with the crystal faces at a molecular level at high temperature to form carbides or nitrides.

The present invention will be understood more readily by reference to the following examples; however, these examples are intended to illustrate the invention and are not to be construed to limit the scope of the invention.

EXAMPLE 1

Magadiite, a lamellar state of polysilicic acid, was prepared by the following method. Amorphous silica and 10% sodium hydroxide aqueous solution were mixed to give the proportional of chemical composition of $SiO_2$ 27, $Na_2O$ 3, and $H_2O$ 70 in percent by weight. The obtained mixture was heated at 100° C. for 48 hours. The reaction product was washed with NaOH aqueous solution (PH=9), and air-dried to form magadiite.

The magadiite thus produced was analyzed by X-ray diffraction. Then it was immersed in 0.01N-HCl aqueous solution, followed by filtration and drying. One hundred grams of the obtained magadiite were immersed in 300 ml of 0.2 mol stearyltrimethylammonium aqueous solution for 24 hours to exchange the sodium ion present in the magadiite interlamellar spaces with stearyltrimethylammonium ion. As a result, there was produced magadiite-stearyltrimethylammonium intercalation compound.

The increase of the basal spacing from 15.6Å in the starting magadiite to 28Å in the obtained compound confirmed the intercalation of stearyltrimethylammonium ion. This compound was immersed in 300 ml of styrene monomer containing 1% of azobisisobutyronitrile as a radical initiator for 48 hours to intercalate the styrene monomer into the interlamellar spaces of the compound, thereby producing magadiite-styrene intercalation compound. This compound was then filtered and heated at 90° C. for two hours to polymerize the styrene monomer. The resultant product was heated at 200° C. for two hours to acquire flame resistant properties, thereby preparing magadiite-polystyrene intercalation compound complex. This complex was calcined in a stream of hydrogen at a temperature 1400° C. for three hours to form silicon carbide. Silicon carbide content was more than 95%, indicating that the amount of silicon carbide prepared was increased by 80% as compared with that obtained by calcining under the same conditions a mixture of magagiite and polystyrene in the same weight ratio. It was confirmed by X-ray diffraction that the calcination product of the complex had a higher crystallinity than that of the calcination product of the mixture.

EXAMPLE 2

One hundred grams of the magadiite prepared in Example 1 were immersed in 300 ml of dimethylformamide for 48 hours to intercalate into the magadiite dimethylformamide in an amount equal to 90 wt % of the magadiite, resulting in the production of dimethylformamide complex. This complex was immersed in 300 ml of 4-vinylpyridine containing 1% of azobisisobutyronitrile as a radical initiator for 48 hours to intercalate 4-vinylpyridine, thereby preparing magadiite-dimethylformamide-4-vinylpyridine intercalation compound. This compound was heated at 80° C. for three hours to polymerize and, then heated at 200° C. for two hours to acquire flame resistant properties, thereby preparing magadiite-polyvinylpyridine intercalation compound. This compound was calcined in a stream of nitrogen of 300 ml/min at 1400 ° C. for three hours to prepare silicon nitride. Its content was more than 95%. When the silicon nitride was compared with the calcination product of the magadiite-polyvinylpyridine mixture, the amount of silicon nitride was increased by 80%. It was also confirmed by X-ray diffraction that the crystallinity of the silicon nitride was higher than that of the calcination product of the mixture.

EXAMPLE 3

Montmorillonite, produced at Aterazawa, Yamagata Prefecture, Japan, was used as a starting material for the intercalation compound. It was natural clay having a lamellar structure. It was purified by elutriation and subjected to X-ray diffraction and thermal analysis to ascertain that it was montmorillonite. Its chemical compositions were $SiO_2$ 57%, $TiO_2$ 0.01%, $Al_2O_3$ 21.9%, $Fe_2O_3$ 1.92%, MgO 3.50%, CaO 0.63%, $Na_2O$ 2.85%, $K_2O$ 0.17%, $H_2O$ (+) 5.80%, and $H_2O$ (−) 5.10%. The cation-exchange capacity was 84.5 milliequivalents/100 grams.

One hundred grams of this montmorillonite were immersed in one liter of 0.2 N dodecylammonium hydrochloride aqueous solution to exchange sodium ions present in the interlamellar spaces with dodecyl ammonium ions. This operation was repeated twice so that the ammonium ion was intercalated sufficiently into the interlamellar spaces. The resultant product was washed with water and dried to prepare montmorillonite-dodecylammonium ion intercalation compound complex.

The above complex was immersed in 300 ml of acrylonitrile monomer containing 0.7% by weight of benzoylperoxide as a polymerization initiator for 24 hours to fully intercalate the acrylonitrile monomer into the montmorillonite interlamellar spaces. The product was filtered to remove excess acrylonitrile monomer, then heated at 50° C. for 24 hours to undergo polymerization to form n-dodecylammonium-montmorillonite-polyacrylonitrile intercalation compound. The enlargement of the interlamellar spaces of the montmorillonite from 13.5Å to 25.6Å confirmed the intercalation of polyacrylonitrile.

The obtained complex was then heated at 220° C. for two hours to acquire flame resistant properties. The flame resistant complex obtained was free from volatilization even when subjected to calcination at high temperature and gave carbides and nitrides by the reaction of polyacrylonitrile with the crystal face of montmorillonite at a molecular level. Calcination was carried out in a stream of nitrogen with a gas flow rate of 500 ml/min at 1400° C. for six hours. There were prepared beta-sialon at 1100° C., beta-silicon carbide at 1150° C., beta-silicon nitride at 1400° C., and aluminum nitride at 1300° C. These temperatures were 100°-200° C. lower than those in the calcination of the montmorillonite-polyacrylonitrile mixture. Their yields were also increased. It was confirmed by X-ray diffraction that the crystallinity was increased.

EXAMPLE 4

Kaolinite having a lamellar structure and being a 1:1 type clay mineral was subjected to X-ray diffraction and thermal analysis to ascertain that it was kaolinite. One hundred grams of kaolinite were immersed in 300 ml of N, N-dimethylformamide for 24 hours.

The increase of the basal spacing from 7.2Å to 12Å obtained by the above treatment confirmed that dimethylformamide was intercalated into the interlamellar spaces of kaolinite.

The amount of dimethylformamide absorbed by kaolinite was equal to 90% by weight of the kaolinite. The produced kaolinite-dimethylformamide complex was filtered to remove excess dimethylformamide, and immersed in 300 ml of styrene monomer containing 1% of azobisisobutyronitrile as a polymerization initiator for 24 hours to exchange the dimethylformamide as a host molecule contained in the interlamellar spaces with styrene monomer as a guest molecule. After filtering off excess styrene monomer, the obtained complex was polymerized by heating at 100° C. for two hours to form kaolinite-polystyrene intercalation compound. It was confirmed by IR absorption spectrum analysis that polystyrene was intercalated into the interlamellar spaces of kaolinite.

When the complex was heated at 250° C. for two hours to acquire flame resistant properties, evaporation of dimethylformamide and contraction of the interlamellar spaces took place, thereby prepared was kaolinite-polystyrene intercalation compound complex due to fast contact of the crystal faces and polystyrene at a molecular level. This complex was calcined in a stream of nitrogen at 1500° C. for two hours. By the reaction of the unit crystal with polystyrene at a molecular level, silicon carbide, silicon nitride, and beta-sialon were formed. A compound prepared by the calcination of a complex according to the present invention was calcined at a temperature 100°-200° C. lower than that used for the calcination of a kaolinite-polystyrene mixture. It was confirmed by X-ray diffraction that the yield and crystallinity were increased.

EXAMPLE 5

Five hundred ml of a 0.5N hydrochloric acid was added to 100 g of aklali titanic acid, $Na_2Ti_3O_7$ or $K_2Ti_4O_9$, having a lamellar structure. The mixed solution was reacted at 70° C. for 24 hours to remove alkali metal. After filtering, 500 ml of 50% n-propylamine solution was added and treated at 70° C. for 48 hours to intercalate n-propylamine ion into the interlamellar spaces. The titanium oxide-propylamine intercalation compound complex obtained was immersed in 300 ml of acrylic acid containing 1% of benzoylperoxide as a polymerization initiator for 24 hours. As a result, propylamine present in the interlamellar spaces was exchanged with acrylic acid as a guest molecule. The resultant product was filtered, and heated at 85° C. for two hours to polymerize acrylic acid, thereby forming an intercalation compound of titanium oxide-polyacrylic acid in which the polyacrylic acid had been intercalated into the interlamellar spaces of titanium oxide. The intercalated polyacrylic acid was confirmed by IR absorption spectrum analysis.

The obtained intercalation compound was ground, and calcined in a stream of nitrogen or under a reducing atmosphere at 1500° C. for two hours. Thus, titanium carbide was formed by the reaction of polyacrylic acid with the crystal face of titanium oxide at a molecular level. The prepared amount of titanium carbide was increased by 80% as compared with the product obtained by the calcination of the titanium oxide-polyacrylic acid mixture under the same conditions.

EXAMPLE 6

To sodium metavanadate solution was added a dilute hydrochloric acid in an amount slightly excess of equivalence to exchange Na ions with H ions, thereby preparing a vanadic acid solution. This solution was aged at 50° C. for 48 hours to prepare dark-red vanadium pentoxide hydrate having a lamellar structure. X-ray diffraction showed that the basal spacing of the vanadium pentoxide hydrate was 8.75Å. One hundred grams of vanadium pentoxide hydrate dried in air were immersed in 200 ml of a 50% ethylene glycol solution for 24 hours while stirring. As a result, the basal spacing was enlarged to 17Å. After filtering, the resulting complex was immersed in 300 ml of acrylic acid monomer containing 1.0% of benzoyl peroxide for 24 hours, thereby thoroughly intercalating acrylic acid monomer into the interlamellar spaces of vanadium pentoxide. After removing excess acrylic acid monomer by filtration, polymerization was conducted at 80° C. for three hours to prepare ethylglycol type vanadium pentoxide-polyacrylic acid intercalation compound complex.

The complex was heated at 220° C. for two hours to drive out ethylene glycol and to conduct flame resistant treatment. The resulting flame resistant complex was reacted with polyacrylic acid on the crystal face of vanadium pentoxide at a molecular level and formed vanadium carbide under a reducing atmosphere. For example, vanadium carbide can be produced by calcining the above complex at 1400° C. for five hours in a stream of CO gas of 300 ml/min. The above temperature was 150° C. lower than that required for the calcination of a vanadium pentoxide-polyacrylic acid mixture under the same conditions. When the calcination temperature was identical, the yield was increased by 90%. X-ray diffraction confirmed that the crystallinity was also increased.

EXAMPLE 7

The vanadium pentoxide hydrate having a lamellar structure prepared in Example 6 was immersed in 200 ml of a 1N N-methylacetamide for 24 hours with occasional stirring to enlarge the basal spacing from 8.75Å to 19Å. After filtering, the resulting substance obtained was immersed in 300 ml of 4-vinylpyridine monomer containing 1.0% of benzoyl peroxide for 24 hours to intercalate 4-vinylpyridine monomer, thereby preparing N-methylacetamide type vanadium pentoxide-4-vinylpyridine intercalation compound. After filtration, the resulting compound was heated at 90° C. for two hours to polymerize 4-vinylpyridine monomer. This complex was heated at 220° C. for two hours to release N-methylacetamide and prepare flame resistant vanadium pentoxide-polyvinyl pyridine intercalation compound complex. This complex was calcined at 1400° C. for five hours in a stream of nitrogen gas of 300 ml/min to prepare silicon nitride. Its purity was more than 90%.

The above silicon nitride was 85% greater in the yield than that of the product prepared by calcining a mixture of vanadium pentoxide and polyvinyl pyridine under the same conditions. X-ray diffraction confirmed that the crystallinity was also higher than that of the product from the mixture.

EXAMPLE 8

One hundred grams of molybdenum sulfide, a lamellar structure of dichalcogen compound, were immersed in 300 ml of pyridine for two hours to intercalate the pyridine molecules into the intermalellar spaces. Molybdenum sulfide-pyridine complex obtained by filtration was immersed in 300 ml of acrylonitrile monomer containing 1% of benzoylperoxide as a polymerization initiator for 24 hours to prepare molybdenum sulfide-acrylonitrile complex. The acrylonitrile contained in this complex was polymerized at 60° C. to prepare an intercalation compound of molybdenum sulfide-polyacrylonitrile.

The obtained compound was heated at 225° C. for 20 hours to acquire flame resistant properties. By this treatment, pyridine was evaporated and the interlamellar spaces were contacted. As a result, there was prepared molybdenum sulfide-polyacrylonitrile compound complex where the crystal faces and polyacrylonitrile were adhered tight at a molecular level. Calcination of the resultant compound in a stream of nitrogen at 1500° C. for two hours caused a reaction of polyacrylonitrile with the crystal faces of molybdenum sulfide at a molecular level to prepare molybdenum nitride. The amount of molybdenum nitride obtained was increased by 70% as compared with that obtained by calcining a mixture of molybdenum sulfide and polyacrylonitrile. It was also confirmed by X-ray diffraction that the crystallinity was increased.

EXAMPLE 9

One hundred grams of clinoptilolite (produced at Itaya, Yamagata Prefecture, Japan), a kind of tectosilicates having a three dimensional network structure, were heated at 500° C. for one hour to drive out water from its pores. The resulting dehydrated clinoptilolite was immersed for 24 hours in a solution which was prepared by mixing 50 parts of urea, 100 parts of formaline, and 0.5 part of aqueous ammonia. The resultant product was filtered, and reacted at 90° C. for one hour to prepare a product of clinoptilolite-urea resin precondensate. The above product was thoroughly kneaded with oxalic acid, heated at a temperature in the range of 80°-90° C. to form a bulk compound, and this bulk compound was ground to prepare a complex of clinoptilolite-urea resin. The resultant complex was gradually heated in a stream of nitrogen to calcinate at 1400° C. for two hours, thereby obtaining beta-sialon, silicon carbide, aluminium nitride, and silicon nitride. Their amounts thus obtained were increased by 70% as compared with that obtained by calcining a mere mixture of clinoptilolite and urea resin. It was also confirmed by X-ray diffraction that their crystallinities wree increased.

EXAMPLE 10

One hundred grams of attapulgite, one of inosilicates having a fibrous structure, were heated at 500° C. for one hour to drive out the water content from prismatic spaces of the attapulgite crystalline structure. The dehydrated attapulgite was immersed for 24 hours in a solution which was prepared by mixing 15 parts of phenol, 15 parts of formalin, and 0.5 part of aqueous ammonia. Then, the mixture was filtered, and heated for two hours until it was boiled to prepare phenol resin, thereby producing attapulgite-phenol resin complex.

The prepared complex was dehydrated at 75° C. under reduced pressure of 30 mmHg and cooled down to form a sample for calcination. This sample was mixed with 5% by weight of graphite powder, and the mixture was finely divided and heated gradually in a stream of nitrogen of 500 ml/min at 1400° C. for two hours to form silicon carbide, silicon nitride, aluminum nitride, and beta-sialon. Their amounts thus obtained were increased by 75% as compared with that obtained by calcining a mere mixture of attapulgite and phenol resin. It was also confirmed that their crystallinities were increased.

EXAMPLE 11

Magadiite-polystyrene intercalation compound complex prepared according to the procedure of Example 1 was pulverized to a size of 400 meshes. The pulverized complex was mixed with 50 wt % of graphite powder and heated at 200° C. for two hours to acquire flame resistant properties. The resulting product was calcined at 1500° C. for three hours in a stream of carbon monoxide of 300 ml/min to prepare whiskers in an amount equal to 60% of the starting material. When the obtained whiskers were observed through an electronic microscope, their diameters were about 5 $\mu$m which was 5-50 times greater than those of the conventional whiskers, indicating their strengths were increased.

What is claimed is:

1. A method for the preparation of nitrides and carbides comprising intercalating at least one member selected from the group consisting of a monomer, a starting material of polycondensate, or a prepolymer into the interlamellar spaces of natural minerals or inorganic compounds having a lamellar structure, preparing an intercalated compound by inducing polymerization or polycondensation of the at least one member, and baking the intercalated compound at a temperature in the range of 1100°-1700° C. under a nitrogen or reducing atmosphere.

2. A method for the preparation of nitrides and carbides comprising intercalating at least one member selected from the group consisting of a monomer, a starting material of polycondensate, or a prepolymer into the vacant spaces of the crystalline structure of natural or synthetic inosilicates having fibrous structure or into those of the crystalline structure of natural or synthetic tectosilicates having three dimensional network structure, preparing an inorganic-organic polymer complex by inducing polymerization or polycondensate of the at least one member, and baking the inorganic-organic polymer complex at a temperature in the range of 1100°-1700° C. under a nitrogen or reducing atmosphere.

* * * * *